(12) United States Patent
Shima

(10) Patent No.: US 6,459,120 B1
(45) Date of Patent: Oct. 1, 2002

(54) SEMICONDUCTOR DEVICE AND MANUFACTURING METHOD OF THE SAME

(75) Inventor: Masashi Shima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 09/635,691

(22) Filed: Aug. 10, 2000

(30) Foreign Application Priority Data

Oct. 15, 1999 (JP) .............................. 11-294198

(51) Int. Cl.[7] .............................................. H01L 29/788
(52) U.S. Cl. ...................................... 257/314; 257/14
(58) Field of Search ............................. 257/14, 22, 314

(56) References Cited

U.S. PATENT DOCUMENTS

| | | | | |
|---|---|---|---|---|
| 5,591,986 A | * | 1/1997 | Niigaki et al. ................ | 257/10 |
| 5,656,821 A | * | 8/1997 | Sakuma ........................ | 257/14 |
| 5,922,621 A | * | 7/1999 | Sakuma ........................ | 438/733 |
| 5,923,046 A | | 7/1999 | Tezuka et al. ................. | 257/24 |
| 6,011,271 A | * | 1/2000 | Sakuma et al. ................ | 257/14 |
| 6,265,733 B1 | * | 7/2001 | Shimoyama et al. ......... | 257/94 |

FOREIGN PATENT DOCUMENTS

JP  10-144877  5/1998

* cited by examiner

*Primary Examiner*—Allan R. Wilson
(74) *Attorney, Agent, or Firm*—Armstrong, Westerman & Hattori, LLP (57) ABSTRACT

A regular tetrahedral groove is formed in a wafer, and a memory unit is formed, which includes a channel layer as a first semiconductor layer to serve as a channel, a three-layer structure floating layer as a second semiconductor layer to serve as a floating gate, and an electrode contact layer as a third semiconductor layer to secure drain contact. The floating layer is formed into a three-layer structure of a p-AlGaAs layer, an i-InGaAs layer and a p-AlGaAs layer. It is possible to provide a semiconductor device capable of securing its sufficient functionality at a room temperature by using a quantum dot structure, and achieving an ultimate high-density integration with high reliability. Also provided is a method capable of easily manufacturing semiconductor devices having such a construction.

8 Claims, 6 Drawing Sheets

DETAILED VIEW OF SEMICONDUCTOR DEVICE STRUCTURE

DETAILED VIEW OF RE-GROWN LAYER EPITAXIAL STRUCTURE

FIG.3

DETAILED VIEW OF SEMICONDUCTOR DEVICE STRUCTURE

FIG. 4

I – I' BAND VIEW
(REGULAR TETRAHEDRAL GROOVE BOTTOM PORTION)

FIG. 5

II – II' BAND VIEW
((111A)FACET)

FIG. 6

REGULAR TETRAHEDRAL
GROOVE QUANTUM DOT

III – III' BAND VIEW
(HORIZONTAL DIRECTION IN QUANTUM WELL LAYER)

MANUFACTURING PROCESS OF REGULAR TETRAHEDRAL GROOVE MEMORY DEVICE

FIG. 8

DETAILED VIEW OF SEMICONDUCTOR DEVICE STRUCUTRE

FIG. 9

DETAILED VIEW OF RE-GROWN LAYER EPITAXIAL STRUCTURE

SEMICONDUCTOR DEVICE AND MANUFACTURING METHOD OF THE SAME

BACKGROUND OF THE INVENTION

1. [Field of the Invention]

The present invention relates to semiconductor devices and manufacturing methods of the same, particularly suitable for applying to semiconductor memories using compound semiconductors with ultimate microstructures.

2. [Description of the Related Art]

In semiconductor devices, highly integrated semiconductor memories operable with low power consumption are required in recent years. As one candidate of such ultimate devices, expectation has been placed on a so-called quantum dot memory, which has a quantum box structure (quantum dot structure) provided as a floating gate to store/emit electrons, and a micro-channel provided to detect a charging operation of electrons to the quantum dot structure by a modulation in current.

In case of flash memories having floating gates, the formation of an ultimate quantum dot structure by reducing size of a semiconductor layer which is to be a floating gate, makes it possible to reduce power consumption and achieve a high-density integration. However, if a quantum dot memory is manufactured using a Si-base material, a $Si/SiO_2$ interface has a high interface state density, which is difficult to reduce. Consequently, it is difficult to form a clean quantum dot structure. In materials for compound semiconductors, interface state density is relatively low. Thus a clean quantum dot structure can be easily formed. However, Because of its low heterojunction barrier height, the memory operates only in a low temperature range, and it is impossible to secure a memory holding time at a room temperature.

An example of semiconductor device using such a quantum dot structure is disclosed in Japanese Patent Application Laid-Open No. 10-144877 (1998). This semiconductor device is designed as a low power consumption memory device, which can modulate a current flowing between source and drain electrodes formed at both ends of a quantum wire by injecting/removing electrons into/out of quantum dot structures formed on the quantum wire. In this case, only one quantum dot structure is provided between the source and drain electrodes, and the memory device can efficiently modulate a current by charging the one quantum dot structure, and can be operated by an ultimately small number of electrons. However, since it is impossible to form source/drain electrodes and gate electrodes in accordance with such a micro-quantum dot structure by means of lithography, it is extremely difficult to manufacture such semiconductor devices at a high yield.

As apparent from the foregoing, semiconductor devices using quantum dot structures are expected as next-generation semiconductor memories capable of achieving ultimate high-density integration. On the other hand, such semiconductor devices involve serious problems including the difficulty of manufacturing, the difficulty of securing sufficient functionality at a room temperature and so on.

SUMMARY OF THE INVENTION

It is an object of the present invention to provide semiconductor devices capable of securing sufficient functionality at a room temperature by using a quantum dot structure, and achieving an ultimate high-density integration with high reliability.

It is another object of the present invention to provide a manufacturing method of semiconductor devices, in which a quantum dot structure can easily be made.

The present invention is directed to semiconductor devices, in particular, compound semiconductor devices, in which a first semiconductor layer of a first conductive type, a second semiconductor layer of a second conductive type, and a third semiconductor layer of the first conductive type are sequentially laminated in this order on a semiconductor substrate. Such a semiconductor device has a quantum box structure at one portion of the second semiconductor layer. The quantum box structure has a smaller band-gap width in comparison with the other portions. Either the energy level of a valence band of the quantum box structure or the acceptor level of the quantum box structure is set to be substantially equal to the Fermi level of the first or third semiconductor layer.

According to an aspect of the present invention, the first conductive type is n-type, and the second conductive type is p-type. The second semiconductor layer has a structure in which p-AlGaAs, i-InGaAs and p-AlGaAs are sequentially laminated in this order. Electrons are injected/emitted only to/from the energy level of the valence band of the quantum box structure by the electrons tunneling through a p-n junction barrier.

According to another aspect of the present invention, the first conductive type is n-type, and the second conductive type is p-type. The second semiconductor layer has a structure in which p-AlGaAs, p-InGaAs and p-AlGaAs are sequentially laminated in this order. Electrons are injected/emitted only to/from the acceptor level of the quantum box structure by the electrons tunneling through a p-n junction barrier.

In a manufacturing method of a semiconductor device according to the present invention, the semiconductor device having the foregoing construction is manufactured. More specifically, the method comprises the steps of: forming a groove structure in a semiconductor substrate; and sequentially laminating, in the groove structure, a first semiconductor layer of a first conductive type, a second semiconductor layer of a second conductive type and a third semiconductor layer of the first conductive type. In the bottom portion of the second semiconductor layer of the groove structure, a quantum box structure having a smaller band-gap width in comparison with the other portions is formed, and either the energy level of a valence band of the quantum box structure or the acceptor level of the quantum box structure is set to be substantially equal to the Fermi level of the first or third semiconductor layer.

According to an aspect of the present invention, the first conductive type is n-type, and the second conductive type is p-type. The second semiconductor layer is formed into a structure by means of an MOVPE method, in which p-AlGaAs, i-InGaAs and p-AlGaAs are sequentially laminated in this order, so that the quantum box structure is naturally formed in the above bottom portion.

According to another aspect of the present invention, the first conductive type is n-type, and the second conductive type is p-type. The second semiconductor layer is formed into a structure by means of an MOVPE method, in which p-AlGaAs, p-InGaAs and p-AlGaAs are sequentially laminated in this order, so that the quantum box structure is naturally formed in the above bottom portion.

According to the semiconductor device of the present invention, the second semiconductor layer located between the first and third semiconductor layers has a quantum box structure (quantum dot structure) with a small band-gap width. Storing electrons in the energy level of a valence band of the quantum box structure or in the acceptor level of the quantum box structure enables the semiconductor device to operate as a memory. In this case, since the barrier height which the stored electrons have to jump over when they are emitted is larger than the band-gap width of the quantum box structure, the probability of unexpected electron injection/emission in the process of thermal excitation is low enough to be ignored. Accordingly, a sufficient electron holding time is secured at a room temperature to assure an accurate operation.

Therefore, according to the present invention, it is possible to realize semiconductor devices capable of securing their sufficient functionality at a room temperature by using such quantum dot structures, and achieving ultimate high-density integration with high reliability. It is also possible to manufacture su h semiconductor devices easily and surely.

DETAILED DESCRIPTION OF THE PREFERRED EMBODIMENTS

Detailed description will be made below for specific embodiments, to which the present invention is applied, with reference to the accompanying drawings.

[First Embodiment]

First, description will be made for the first embodiment of the present invention. Here, as a semiconductor device, a compound semiconductor memory having a quantum dot structure will be explained.

The construction of the compound semiconductor memory device of this embodiment will be first described in its schematic fashion.

Figure 1A:
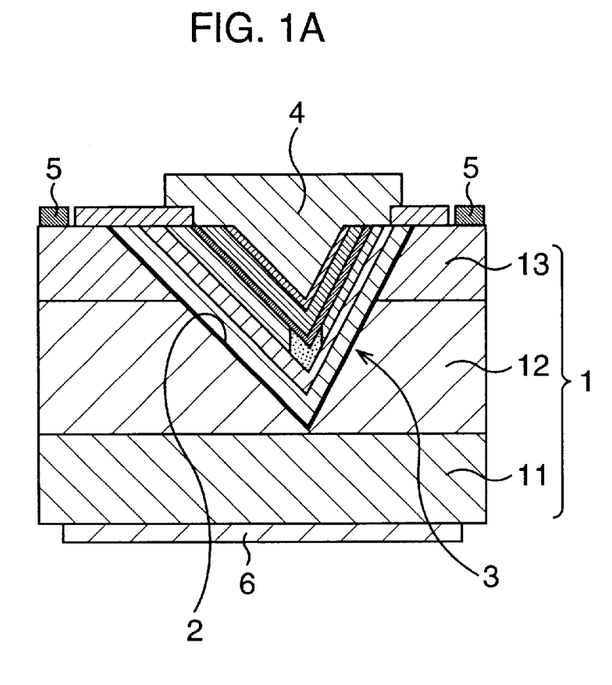
FIGS. 1A and 1B are schematic sectional and plan views showing a principal construction of a semiconductor memory device according to the first embodiment of the present invention.
Figure 1B:
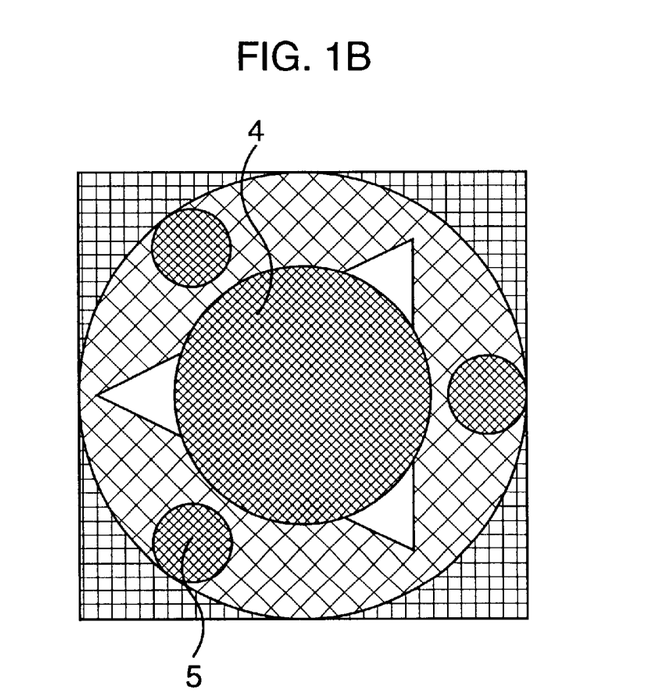

FIGS. 1A and 1B schematically illustrate a principal construction of the semiconductor memory device of this embodiment. FIG. 1A is a schematic sectional view thereof, and FIG. 1B is a schematic plan view thereof.

This semiconductor memory device is constructed in the manner that a regular tetrahedral groove 2 is formed in a wafer 1 having a structure formed by sequentially laminating a non-doped i-GaAs layer 12 and an n-type n-GaAs layer 13 on an n-GaAs layer 11 as a compound semiconductor substrate, a memory unit 3 having a roughly three-layer structure made of various compound semiconductors is formed to be embedded in the groove 2, a gate electrode 4 is formed on the memory unit 3, a drain electrode 5 is formed on one side of the memory unit 3, and a source electrode 6 is formed below the n-GaAs layer 13.

Figure 2:
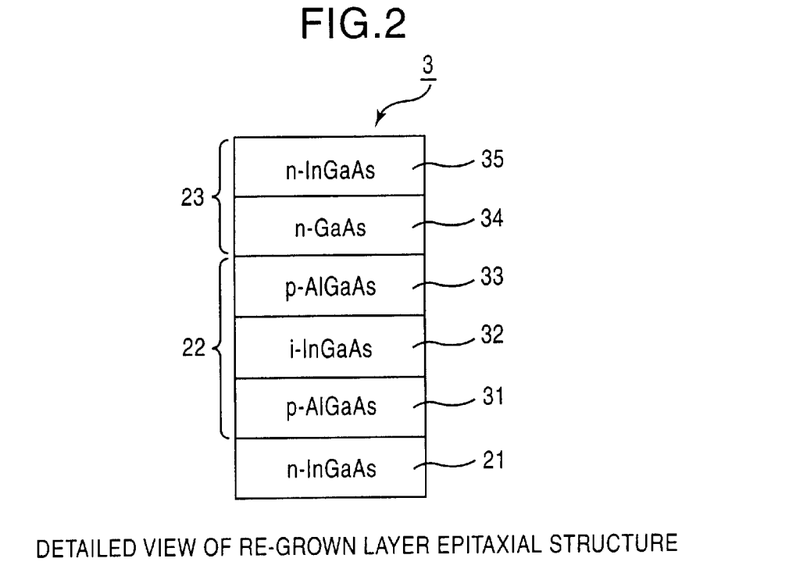
FIG. 2 is a diagrammatic sectional view showing the structure of a memory unit (TSR) of the semiconductor memory device according to the first embodiment.

As shown in FIG. 2, the memory unit 3 includes the following portions in the groove 2: a channel layer 21 as a first semiconductor layer made of n-InGaAs and provided to function as a channel; a three-layer structure floating layer 22 as a second semiconductor layer provided to function as a floating gate; and an electrode contact layer 23 as a third semiconductor layer provided to secure gate contact.

The floating layer 22 is formed in a three-layer structure holding an electron storage layer 32 for injecting/emitting electrons between lower and upper barrier layers 31 and 33. The lower barrier layer 31 is made of p-AlGaAs showing an electron affinity lower than that of the channel layer 21. The electron storage layer 32 is made of i-InGaAs showing an electron affinity higher than that of the lower barrier layer 31. The upper barrier layer 33 is made of p-AlGaAs showing an electron affinity lower than that of the electron storage layer 32.

Here, the lower barrier layer 31 may be formed to be thick, and the upper barrier layer 33 may be formed to be thin. Conversely, the lower barrier layer 31 may be formed to be thin, and the upper barrier layer 31 may be formed to be thick. In the former case, electron injection/emission is carried out between the electrode contact layer 23 and a later-described quantum dot structure 41 through the upper barrier layer 33, which has an advantage of preventing a writing/deleting gate voltage from being affected by a drain voltage. In the latter case, electron injection/emission is carried out between the micro-channel 42 illustrated by a broken line of the channel layer 21 and the quantum dot structure 41 through the lower barrier layer 31, which has an advantage of reducing current leakage from the gate electrode.

The electrode contact layer 23 is formed by laminating a lower electrode contact layer 34 made of n-GaAs and an upper electrode contact layer 35 made of n-InGaAs. In this case, a high speed for performing a writing/deleting operation can be achieved by reducing a p-n barrier height to increase a tunnel probability.

In this semiconductor memory device, the quantum dot structure 41 for performing electron injection/emission is formed in a place equivalent to a bottom portion of the groove 2 of the electron storage layer 32. In this case, in the lower and upper barrier layers 31 and 33, doping of the channel layer 21 with reverse conductive (p-type) impurities is carried out to increase an energy level of a region including the quantum dot structure 41, and an energy level of a valence band in the quantum dot structure 41 takes a value substantially equal to that of the Fermi level of the channel layer 21.

Figure 3:
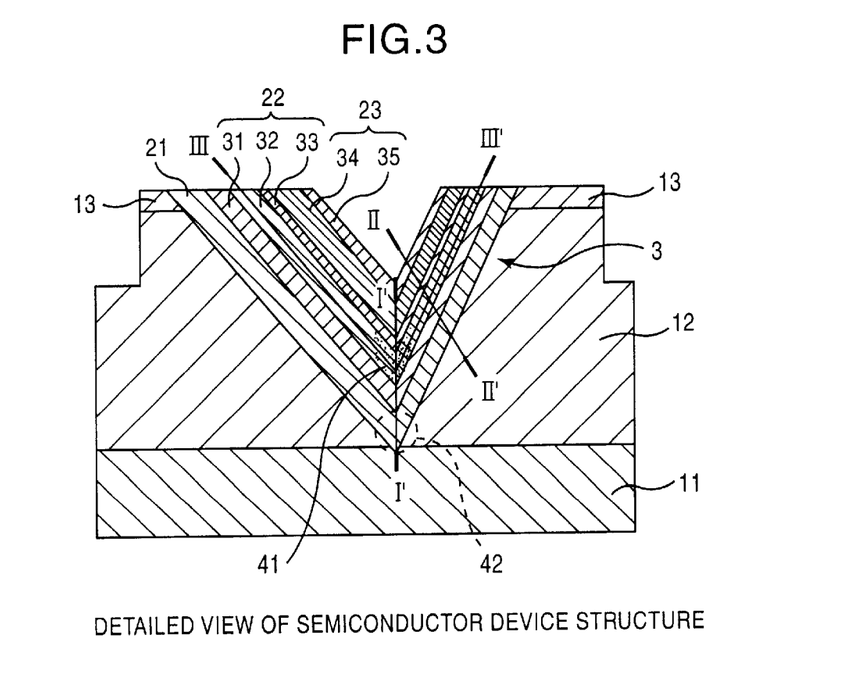
FIG. 3 is a schematic sectional view of the vicinity of the memory unit (TSR) of the semiconductor memory device according to the first embodiment.
Figure 4:
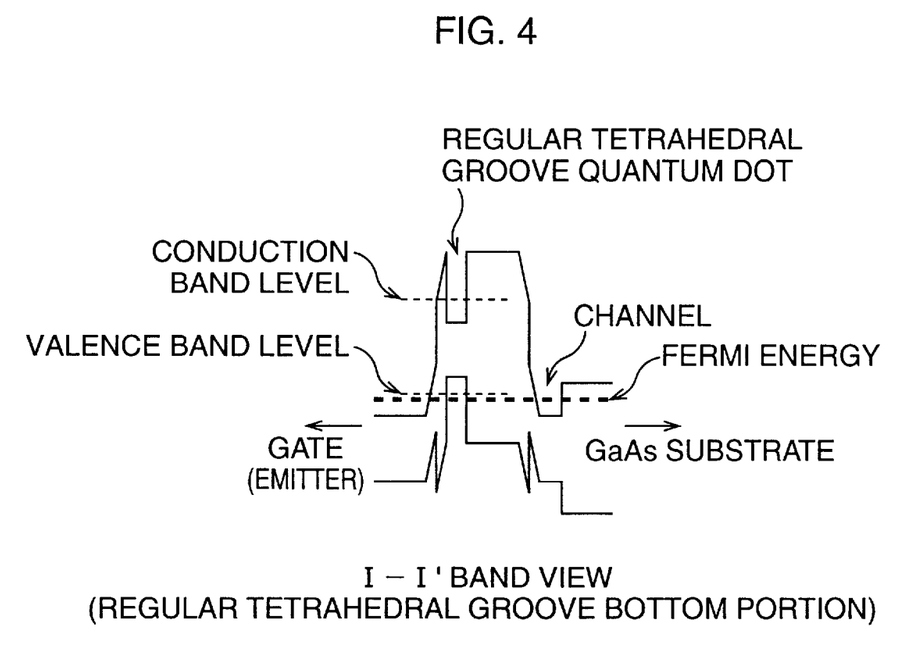
FIG. 4 is a chart showing energy bands in a section ((111B) facet) taken on line I—I' of FIG. 3.
Figure 5:
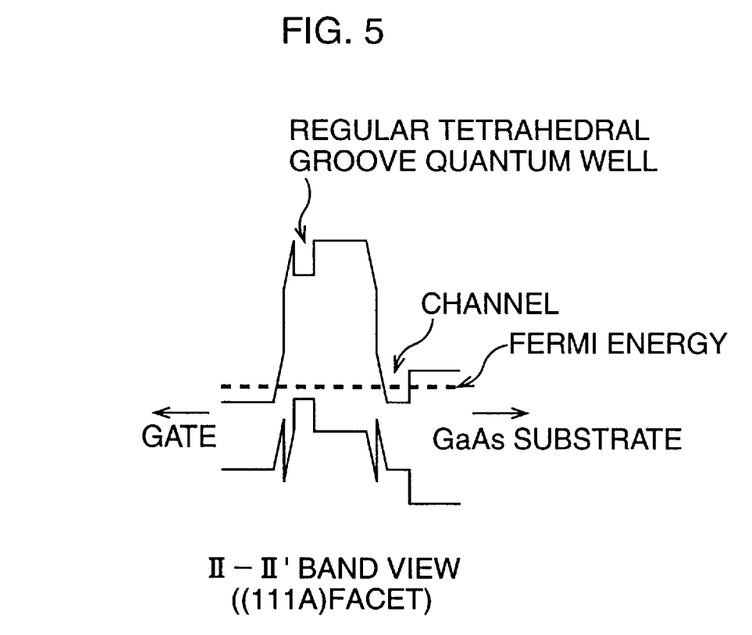
FIG. 5 is a chart showing energy bands in a section ((111A) facet) taken on line II—II' of FIG. 3.
Figure 6:
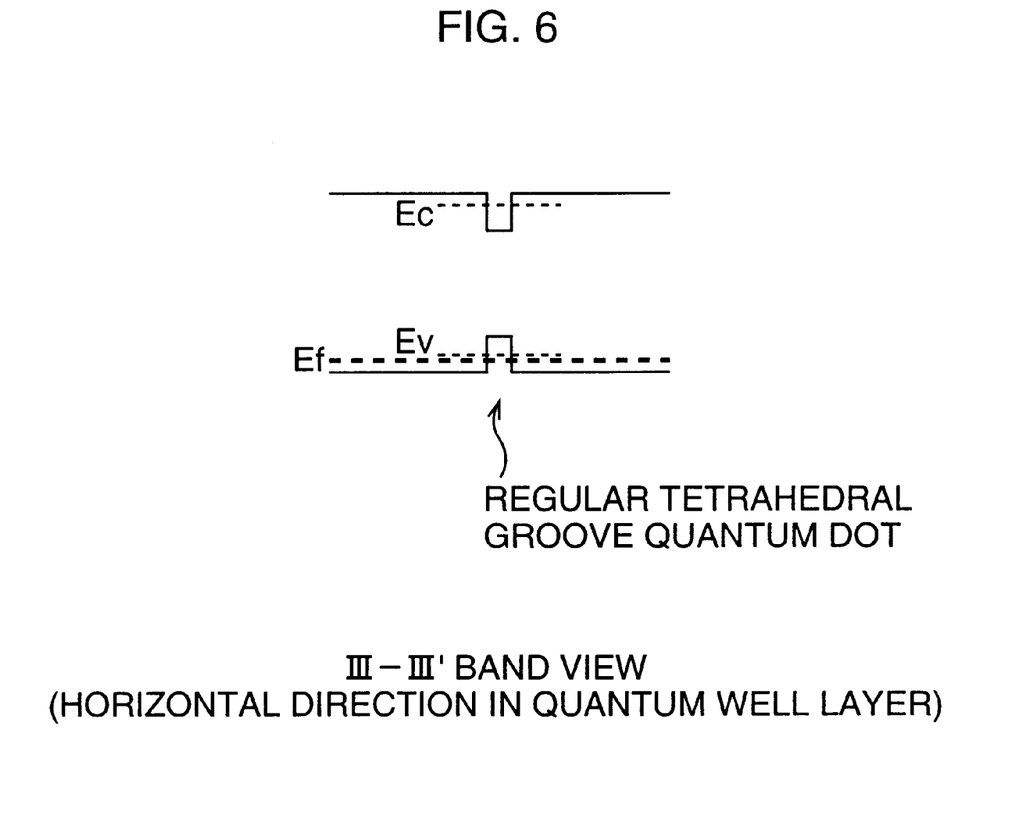
FIG. 6 is a chart showing energy bands in a section taken on line III—III' of FIG. 3.

An energy level of the semiconductor memory device is shown in each of FIGS. 4 to 6. Here, FIG. 4 shows energy bands in a section ((111B) facet) taken on line I—I' of FIG. 3; FIG. 5 shows energy bands in a section ((111A) facet) taken on line II—II' of FIG. 3; and FIG. 6 shows energy bands in a section taken on line III—III' of FIG. 3.

This semiconductor memory device operates as a storage element (memory) by using inter-band tunneling to inject/emit electrons from the energy level of a conduction band in the gate electrode 4 located on the n-GaAs layer 11 to the energy level of the valence band of the quantum dot structure 41 and storing electrons in the energy level of the valence band of the quantum dot structure 41.

More specifically, as shown in FIG. 4 (and FIG. 6), in the bottom portion in the groove 2 of the electron storage layer 32, the energy level of the valence band in the quantum dot structure 41 lies at a value substantially equal to the Fermi level of the channel layer 21. On the other hand, as shown in FIG. 5 (and FIG. 6), in the other portions in the groove 2 of the electron storage layer 32, the energy level of the valence band lies on an energy side lower than the Fermi level of the channel layer 21, and always filled with electrons. It can therefore be understood that in the semiconductor memory device, the Fermi level of the channel layer 21 lies within a band-gap, except the quantum dot structure 41, and by tunneling electrons through the p-n junction barrier, electron injection/emission is carried out only at the energy level of the valence band of the quantum dot structure 41. Hereupon, a barrier height which electrons stored in the quantum dot structure 41 have to jump over when they are emitted to the gate electrode 4 becomes larger than the band-gap width of the electron storage layer 32. Accordingly, a probability of electron injection/emission in the process of thermal excitation becomes very small. Thus, the semiconductor memory device can operate at a high temperature (room temperature).

Next, description will be made below for a manufacturing method of the compound semiconductor memory device of this embodiment.

FIGS. 7A to 7E are schematic sectional views showing the manufacturing method of the semiconductor memory device of this embodiment in the order of manufacturing steps.

Figure 7A:
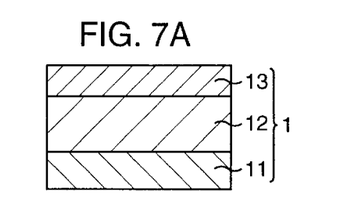
FIGS. 7A to 7E are schematic sectional views showing a manufacturing method of the semiconductor memory device of the first embodiment in the order of manufacturing steps.

First, as shown in FIG. 7A, a wafer 1 is made by sequentially forming, on a substrate, an n-GaAs layer 11 to have a thickness of about 0.1 $\mu$m as an n-type semiconductor layer doped with selenium (Se) at a high concentration of $5 \times 10^{18}$ (/cm$^3$), a non-doped i-GaAs layer 12 to have a thickness of about 3 $\mu$m as a non-doped semiconductor layer; and an n-GaAs layer 13 to have a thickness of about 0.1 $\mu$m as an n-type semiconductor layer doped with Se at a high concentration of $5 \times 10^{18}$ (/cm$^3$).

Figure 7B:
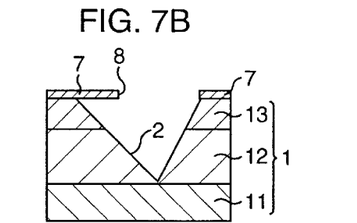

Subsequently, as shown in FIG. 7B, after an insulating film 7 of SiO$_2$ is deposited to have a thickness of about 200 nm on the wafer 1 by means of plasma CVD, a very small opening 8 having a diameter of about 1 $\mu$m is formed at a constant pitch, for example, about 10 $\mu$m, in the insulating film 7 by means of EB lithography. Then, the regular tetrahedral groove 2 is formed by subjecting the wafer 1 to anisotropic etching from the opening 8, using, for example, bromine methanol. In this case, the groove 2 is formed such that its vertex can be located in the vicinity of an interface between the n-GaAs layer 11 and the i-GaAs layer 12.

Figure 7C:
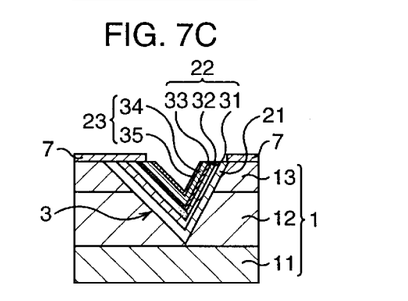

Subsequently, as shown in FIG. 7C, an n-InGaAs layer, for example, having Se doped at a high concentration of $1 \times 10^{18}$ (/cm$^3$) is deposited to a thickness of about 15 nm in the groove 2 by using an MOVPE re-growth method, as a semiconductor layer subjected to n-type and showing a high electron affinity doping. Thus, a channel layer 21 is formed.

Next, as a semiconductor layer (a first barrier layer) showing an electron affinity lower than that of the channel layer 21, by using, for example, C (carbon) as a dopant, a p-AlGaAs layer is deposited to a thickness of about 15 nm to form a lower barrier layer 31. Next, as a semiconductor layer showing an electron affinity higher than that of the lower barrier layer 31, a non-doped i-InGaAs layer is deposited to a thickness of about 10 nm to form an electron storage layer 32. Further, as a semiconductor layer (a second barrier layer) showing an electron affinity lower than that of the electron storage layer 32, by using C as a dopant, a p-AlGaAs layer is deposited to a thickness of about 10 nm to form an upper barrier layer 33. The lower barrier layer 31, the electron storage layer 32 and the upper barrier layer 33 compose a floating layer 22.

Hereupon, when the lower barrier layer 31 is grown on the (111) A facet, C is easily taken in and the electron storage layer 32 is grown. Thus, the quantum dot structure 41 is naturally formed in the bottom portion of the regular tetrahedral groove 2. Accordingly, on the (111) B facet in the bottom portion of the groove 2, an energy level of the valence band of the quantum dot structure 41 lies on an energy side higher than the Fermi level. On the (111) A facet, an energy level of the valence band lies on an energy side lower than the Fermi level.

Next, lower and upper electrode contact layers 34 and 35 are sequentially grown: the lower electrode contact layer 34 being formed by depositing an n-GaAs layer doped with, for example, Se at a high concentration of $1 \times 10^{18}$ (/cm$^3$) to a thickness of about 100 nm, and the upper electrode contact layer 35 being formed by depositing an n-InGaAs layer similarly doped with Se at a high concentration of $1 \times 10^{18}$ (/cm$^3$) to a thickness of about 100 nm. The lower and upper electrode contact layers 34 and 35 compose an electrode contact layer 23 for the gate electrode 4.

Figure 7D:
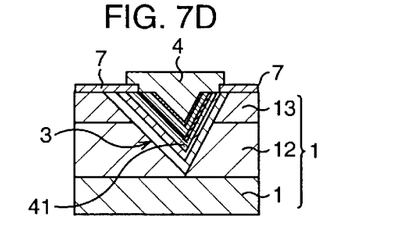

Subsequently, as shown in FIG. 7D, for example, an Al layer is vapor-deposited to have a thickness of about 200 nm on the electrode contact layer 23, and the gate electrode 4 is formed by patterning the Al layer in an electrode shape.

Figure 7E:
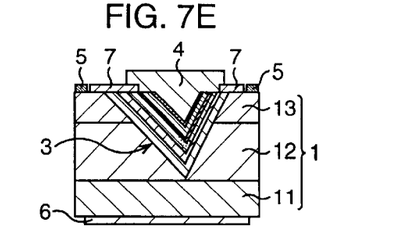

Subsequently, as shown in FIG. 7E, AuGe/Au layer are vapor-deposited to have thicknesses of 50 nm/200 nm on the electrode contact layer 23 around the regular tetrahedral opening 8 and on the backside of the wafer 1. Then, by performing one-minute alloy treatment at 450° C., drain and source electrodes 5 and 6 are formed to serve as ohmic electrodes.

Through the foregoing steps, the semiconductor memory device is manufactured, which injects/removes electrons into/out of the energy level of the valence band of the quantum dot structure 41, and thus detects a change of current flowing through an FET channel formed on the (111) A facet of the regular tetrahedral groove 2.

As described above, according to this embodiment, it is possible to realize the semiconductor memory device, which can secure sufficient functionality at a room temperature by using the quantum dot structure 41 and can achieve highly reliable and an ultimate high-density integration.

In the described embodiment, the memory unit 3 is formed in the tree-layer structure of the channel layer 21 as the n-type layer, the floating layer 22 as the p-type layer and the electrode contact layer 23 as the n-type layer. But the three-layer structure may be composed of a p-type layer, an n-type layer and a p-type layer. In this case, the structure of the floating layer 22 is made of, for example, n-AlGaAs, i-InGaAs and n-AlGaAs. In the semiconductor memory device, holes become carriers in place of electrons.

[Second Embodiment]

Next, description will be made for the second embodiment of the present invention. Like the first embodiment, as a semiconductor device, a compound semiconductor memory device having a quantum dot structure will be explained, but a floating gate is slightly different in characteristic from that of the first embodiment. The same components as those of the first embodiment are denoted by the same reference numerals as those of the first embodiment, and description thereof will be omitted.

Figure 8:
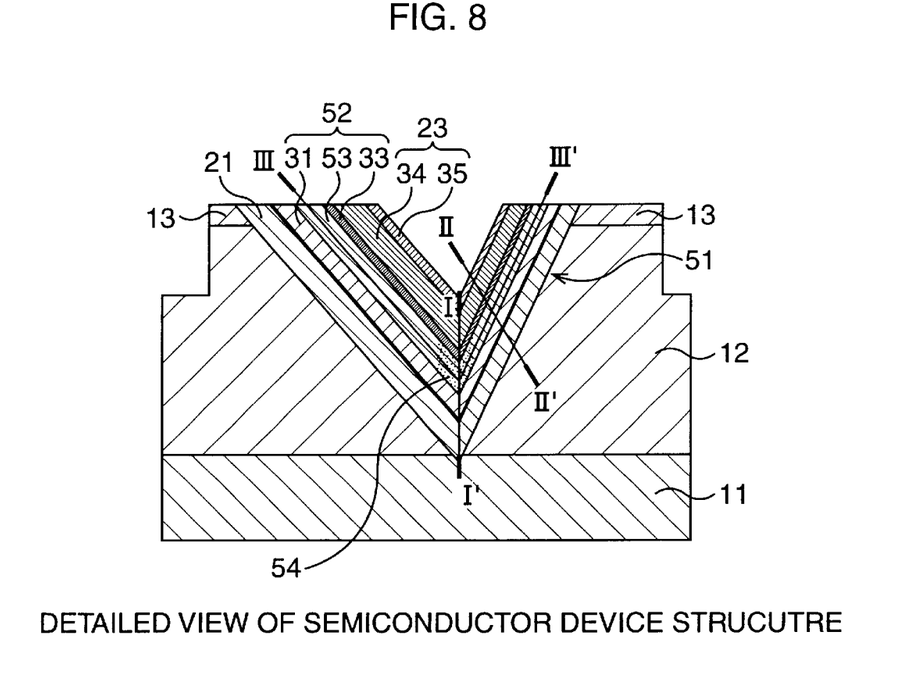
FIG. 8 is a schematic sectional view of the vicinity of a regular tetrahedral groove of a semiconductor memory device according to the second embodiment of the present invention.

FIG. 8 is a schematic sectional view of the vicinity of a regular tetrahedral groove of the semiconductor memory device of this embodiment.

In the regular tetrahedral groove 2, a memory unit 51 having a roughly three-layer structure made of various compound semiconductors is formed to be embedded. A gate electrode 4 is formed on the memory unit 51; a drain electrode 5 on one side of the memory unit 51; and a source electrode 6 below an n-GaAs layer 13.

Figure 9:
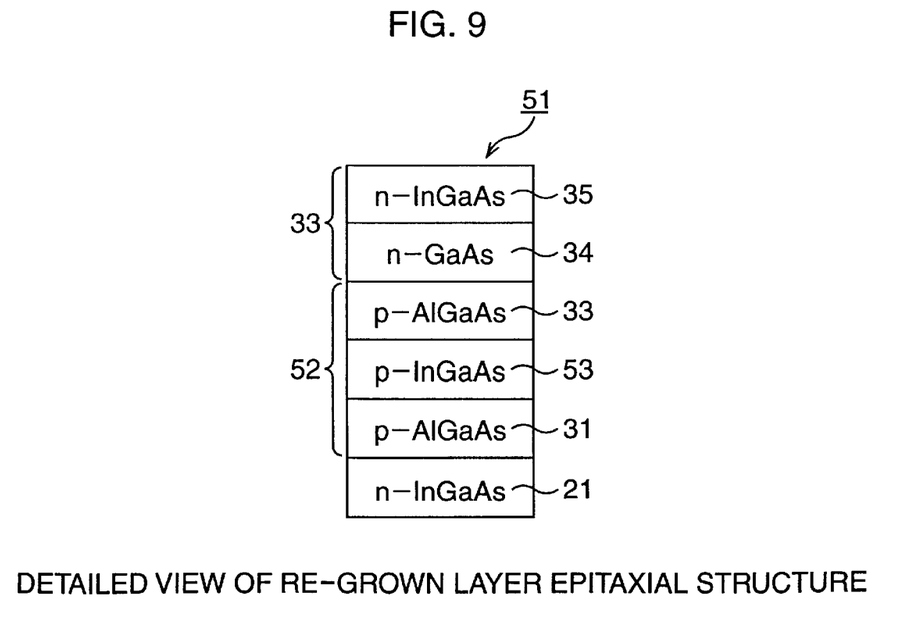
FIG. 9 is a diagrammatic sectional view showing the structure of a memory unit (TSR) of the semiconductor memory device of the second embodiment.

As shown in FIG. 9, the memory unit 51 includes, in the groove 2, a channel layer 21 made of n-InGaAs and formed as a fist semiconductor layer to serve as a channel; a floating layer 52 having a three-layer structure and formed as a second semiconductor layer to serve as a floating gate; and an electrode contact layer 23 formed as a third semiconductor layer to secure drain contact.

The floating layer 52 is formed in a three-layer structure in which an electron storage layer 53 for performing electron injection/emission is held between lower and upper barrier layers 31 and 33. The lower barrier layer 31 is made of p-AlGaAs showing an electron affinity lower than that of the channel layer 21. The electron storage layer 53 is made of p-InGaAs showing an electron affinity higher than that of the lower barrier layer 31. The upper barrier layer 33 is made of p-AlGaAs showing an electron affinity lower than that of the electron storage layer 53.

In the described semiconductor memory device, a quantum dot structure 54 for performing electron injection/emission is formed in a place equivalent to the bottom portion of the groove 2 of the electron storage layer 53. In this case, in the lower and upper barrier layers 31 and 33, doping of the channel layer 21 with reverse conductive (p-type) impurities is carried out to increase an energy level of region including the quantum dot structure 54, doping is carried out in the electron storage layer 53 with p-type impurities at a concentration lower than that for the lower and upper barrier layers 31 and 33, and an acceptor level in the quantum dot structure 54 takes a value substantially equal to the Fermi level of the channel layer 21.

The semiconductor memory device operates as a memory by using inter-band tunneling to inject/emit electrons from the energy level of a conduction band in the gate electrode 4 on the n-GaAs substrate 11 to the acceptor level of the quantum dot structure 54, and storing electrons in the acceptor level of the quantum dot structure 54.

A manufacturing method of the semiconductor memory device of the described embodiment is almost similar to that of the first embodiment, but the step of forming the floating layer 52 is slightly different.

More specifically, by using, for example, C as a dopant, a p-AlGaAs layer is deposited to a thickness of about 15 nm to form a lower barrier layer 31, then also by using C as a dopant, a p-InGaAs layer is deposited to a thickness of about 10 nm to form an electron storage layer 53 as a semiconductor layer showing an electron affinity higher than that of the lower barrier layer 31, and a p-AlGaAs layer is deposited by using C as a dopant to a thickness of about 10 nm to form an upper barrier layer 33 as a semiconductor layer (a second barrier layer) showing an electron affinity lower than that of the electron storage layer 53. In this case, an impurity concentration of the electron storage layer 53 is controlled to be lower in comparison with the lower and upper barrier layers 31 and 33.

Hereupon, when the lower barrier layer 31 and the electron storage layer 53 are grown on the (111) A facet, C is easily taken in, and the quantum dot structure 54 is naturally formed in the bottom portion of the regular tetrahedral groove 2. Accordingly, on the (111) B facet in the bottom portion of the groove 2, the acceptor level of the quantum dot structure 54 lies on an energy side higher than the Fermi level. On the (111) A facet, the acceptor level lies on an energy side lower than the Fermi level.

The other steps are similar to those of the first embodiment. Through these steps, the semiconductor memory device can be manufactured, which injects/removes electrons into/out of the acceptor level of the quantum dot structure 54, and thus detects a change of current flowing through an FET channel formed on the (111) A facet in the regular tetrahedral groove 2.

As apparent from the foregoing, according to the described embodiment, it is possible to realize a semiconductor memory device, which can secure sufficient functionality at a room temperature by using the quantum dot structure 54 and can achieve highly reliable and an ultimate high-density integration.

Although the preferred embodiments of the present invention have been described in detail, it should be understood that various changes, substitutions and alternations can be made therein without departing from spirit and scope of the invention as defined by the appended claims.

What is claimed is:

1. A semiconductor device including a first semiconductor layer of a first conductive type, a second semiconductor layer of a second conductive type, and a third semiconductive layer of said first conductive type which are sequentially deposited in this order on a semiconductor substrate, a groove formed through said third semiconductor layer into said second semiconductor layer and a channel layer, a floating gate layer, and an electrode contact layer sequentially deposited in this order to fill up said groove, wherein said device has a quantum box structure at one portion of said floating gate layer, said quantum box structure having a smaller band-gap width in comparison with the other portions, and either the energy level of a valence band of said quantum box structure or the acceptor level of said quantum box structure is set to be substantially equal to the Fermi level of said first or third semiconductor layer.

2. The device according to claim 1, wherein said first conductive type is n-type, and said second conductive type is p-type, said second semiconductor layer has a structure in which p-AlGaAs, i-InGaAs, and p-AlGaAs are sequentially laminated in this order, and electrons are injected/emitted only to/from said energy level of said valence band of said quantum box structure by said electrons tunneling through a p-n junction barrier.

3. The device according to claim 1, wherein said first conductive type is n-type, and said second conductive type is p-type, said second semiconductor layer has a structure in which p-AlGaAs, p-InGaAs and p-AlGaAs are sequentially laminated in this order, and electrons are injected/emitted only to/from said acceptor level of said quantum box structure by said electrons tunneling through a p-n junction barrier.

4. A semiconductor device including a first compound semiconductor layer of a first conductive type, a second compound semiconductor layer of a second conductive type, and a third compound semiconductor layer of said first conductive type which are sequentially laminated in this order on a compound semiconductor substrate, a groove formed through said third compound semiconductor layer into said second compound semiconductor layer, and a channel layer, a floating gate layer, and an electrode contact layer sequentially deposited in this order to fill up said groove, wherein said device has a quantum box structure at one portion of said floating gate layer, said quantum box structure having a smaller band-gap width in comparison with the other portions, and either the energy level of a valence band of said quantum box structure or the acceptor level of said quantum box structure is set to be substantially equal to the Fermi level of said first or third compound semiconductor layer.

5. The device according to claim 4, wherein a micro-channel is provided in second semiconductor layer at a bottom portion of said channel layer in the vicinity of said quantum box structure to detect a charging operation of electrons to said quantum box structure.

6. The device according to claim 5, wherein said second semiconductor layer has a structure in which p-AlGaAs, i-InGaAs and p-AlGaAs are sequentially laminated in this order, said lower p-AlGaAs being thicker than said upper p-AlGaAs, and electrons are exchanged between said third semiconductor layer an said quantum box structure through said upper p-AlGaAs.

7. The device according to claim 5, wherein said second semiconductor layer has a structure in which p-AlGaAs, i-InGaAs and p-AlGaAs are sequentially laminated in this order, said lower p-AlGaAs being thinner than said upper p-AlGaAs, and electrons are exchanged between said micro-channel and said quantum box structure through said lower p-AlGaAs.

8. The device according to claim 6, wherein said third semiconductor layer has a structure in which n-GaAs and n-InGaAs are sequentially laminated in this order.

* * * * *